Aug. 1, 1967 A. M. LUECK 3,334,279

DIODE CONTACT ARRANGEMENT

Filed July 30, 1962

Arthur M. Lueck
INVENTOR

BY John D. Graham

ATTORNEY

United States Patent Office 3,334,279
Patented Aug. 1, 1967

3,334,279

DIODE CONTACT ARRANGEMENT

Arthur M. Lueck, Dallas, Tex., assignor to Texas Instruments Incorporated, Dallas, Tex., a corporation of Delaware Filed July 30, 1962, Ser. No. 213,270
5 Claims. (Cl. 317—234)

This invention relates to semiconductor devices and more particularly to a technique for making contact to an alloy dot in a diode.

A p-n junction diode having very high impurity concentrations in both p-type and n-type regions and having a very abrupt junction exhibits a negative resistance characteristic which is attributed to quantum mechanical tunneling. Tunnel diodes are usually made by alloying a very small dot of material containing a doping agent to a wafer of highly doped semiconductor material and then contacting the dot with an electrode configuration that reduces the series inductance to a minimum. It is difficult to fabricate a device with the preferred geometry, however, due to the fact that the electrode has considerable thermal inertia. When sufficient heat is applied to bond the dot to the electrode, the p-n junction will become graded rather than abrupt. The junction must be formed by heating very rapidly to a point just adequate to alloy the bottom portion of the dot with the semiconductor wafer, and then removing the heat. Any further heat, such as that necessary to bond a large contact to the dot, serves to increase the width of the p-n junction or decrease the gradient of excess impurity atoms in the junction area. In an attempt to overcome this problem, connection to the alloy dot has been made by a pressure contact, but this has proved unsatisfactory since there is a tendency for the junction area to be damaged by the pressure applied, especially when the junction has been etched away to make it as small in area as possible. Instead of using a broad-area contact, connection to the alloy dot may be made by a small wire which is inserted into the dot as it is melted, but this results in high lead inductance.

It is therefore the principal object of this invention to provide an improved tunnel diode and a method for making tunnel diodes. Another object is to provide a contact arrangement for a semiconductor diode of the type having a small alloy dot which forms the p-n junction. An additional object is to provide a technique for securing a contact to the alloy dot of a tunnel diode at the same time that the dot is fused to the semiconductor wafer. A further object is to provide a tunnel diode with a large-area, fused contact to the alloy dot.

In accordance with this invention, a wire mesh is used as a contact to a semiconductor device, such as a tunnel diode. This mesh is resilient, preventing damage to the alloy dot and the junction in a tunnel diode when the unit is packaged, and also avoiding stresses due to thermal expansion and contraction in the finished device. This mesh contact may be fused to the alloy dot at the same time that the dot is alloyed with the wafer without adversely affecting the junction.

The novel features believed characteristic of this invention are set forth in the appended claims. The invention itself, however, along with further objects and advantages thereof, may best be understood by reference to the following detailed description of an illustrative embodiment, when read in conjunction with the accompanying drawing, wherein:

Figure 1:
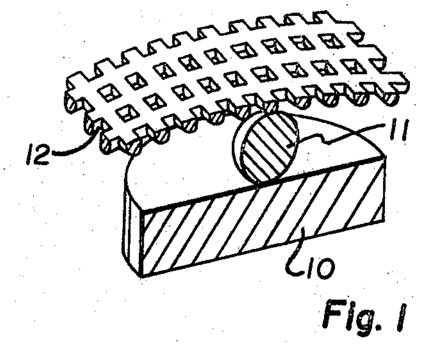
FIG. 1 is a pictorial view in section of a portion of a diode using the principles of the invention, in an early stage of fabrication.

An example of a method for practicing this invention is illustrated beginning with FIG. 1, where a wafer 10 of semiconductor material is shown with a dot 11 which is to be the alloy material positioned thereon. If a tunnel diode is the device to be made, the wafer may be composed of p-type gallium antimonide which is doped with zinc to a level of about $3 \times 10^{19}$ atoms/cc. Of course, other semiconductor materials may be used to make tunnel diodes, such as germanium or gallium arsenide, or if the wire mesh contact of this invention is used in applications other than tunnel diodes, any suitable semiconductor material may be used. In making a tunnel diode, the dot 11 may comprise a tin-tellurium alloy or a gold-tin-tellurium alloy, for example, although obviously other materials may be used. The wafer may be disc-shaped, 20 mils in diameter and 5 mils in thickness, while the dot 11 may be generally spherical with a 3 to 5 mil diameter.

A segment of wire mesh 12 is laid over the top of the dot and wafer before alloying. This mesh 12 may be gold-plated nickel, the individual conductors of which have a diameter of about one mil with the conductors being spaced from one another by about one mil. Nickel mesh is commercially available in this size and may be easily gold-plated. This is not woven mesh, but instead is formed in a grid so that the overall thickness is less than a mil. Depending upon the material of the alloy dot 11, this mesh could just as well be made of other material, for example, platinum, silver or gold. Only a small portion of the mesh is illustrated in FIG. 1, but a segment of perhaps 100 mils square or in diameter would be used since the mesh is later used to contact one of the electrodes in the final package. Alternatively, a strip of wire mesh may be used instead of the circle or square, this being perhaps 10 mils wide and 100 mils long. It may be necessary to use a small amount of rosin flux to hold the dot and wire mesh in place during the alloying process.

Figure 2:
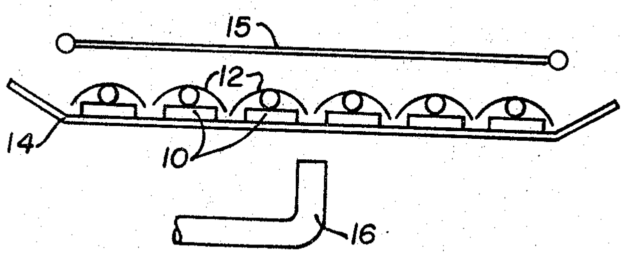
FIG. 2 is a schematic representation of an arrangement for alloying the diode assemblies.
Figure 3:
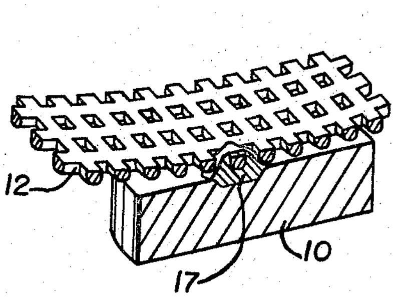
FIG. 3 is a sectional elevation view of the device of FIG. 1 after alloying.

Referring now to FIG. 2, a large number of the assemblies described thus far may then be placed in a thin tantalum boat 14. The boat is positioned in an alloying chamber beneath an overhead strip heater 15 in an atmosphere of forming gas, the latter being typically 10% hydrogen and 90% nitrogen. Current is passed through the strip heater 15 for about 12 to 15 seconds to heat the diode assemblies to a temperature of about 460° to 560° C. The wafers and their now-alloyed dots are then cooled as rapidly as possible, a suitable technique for doing this being to direct a cold stream of forming gas at the lower surface of the boat 14 from a jet 16, this being started as soon as the current is cut off in the strip heater. The conduit going to the jet 16 may pass through a bath of liquid nitrogen for cooling. This technique results in devices as illustrated in FIG. 3, where it is seen that the mesh 12 is firmly embedded in a fused dot 17 which is what remains of the tin-tellurium dot 11. A quite abrupt p-n junction will be provided beneath the dot 17, with the regrown region above the junction being doped with Te to a level of perhaps $10^{20}$ atoms/cc.

Figure 4:
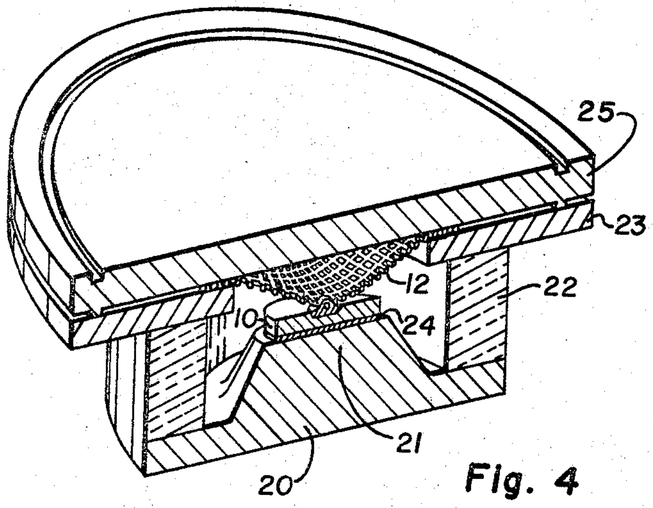
FIG. 4 is a pictorial view in section of the packaged assembly.

The devices are then ready for encapsulation in a suitable package such as is shown in a sectional pictorial view in FIG. 4. The lower portion includes a circular base plate 20 composed of gold-plated Kovar having a raised member 21 formed on the top. A ceramic ring 22 is brazed to the plate 20 and a flat gold-plated Kovar ring 23 is brazed to the top of the ceramic ring; all of this being done before a diode assembly is placed inside. The semiconductor wafer is bonded to the member 21 by a low-melting-point, gold-tin alloy solder 24. This solder is melted by placing the units on a strip heater with the base plates 20 down and heating briefly to 270° to 300° C., this being far below the alloying temperature for the semiconductor material so that the junction will not become graded. The mesh 12 now extends out over the top of the ring 23 and is secured thereto by spot welding at several points. The packaging is completed by welding a metal disc 25 to the ring 23. The diode is then in a so-called "pill" package, with one electrode being the base plate 20 and the other being the disc 25.

Prior to placing the top cover on the package, the device may be subjected to an etching technique to clean the semiconductor surface and, if desired, to reduce the cross-sectional area of the junction. If the latter is done, it may be necessary to mask the dot 17 or otherwise use selective etching techniques.

While the invention has been described with reference to an illustrative embodiment, this description is not to be construed in a limiting sense. Various modifications may be made by persons skilled in the art, and so it is contemplated that the appended claims will cover any such modifications as fall within the true scope of the invention.

What is claimed is:

1. In an electrical device having a body of semiconductor material, a conductive member fused with a surface of said body, and a resilient dish-shaped conductive mesh comprising a series of interconnected cross-wise extending conductors having a portion at the bottom thereof fused to said member providing a yieldable electrical connection thereto.

2. A resilient dish-shaped conductive mesh contact for a semiconductor device comprising a series of interconnected cross-wise extending conductors having a portion at the bottom thereof fused to an alloyed protrusion of said device.

3. A semiconductor device comprising:
(a) a body of semiconductor material,
(b) a small dot of material containing doping impurity alloyed with a major face of said body,
(c) a resilient dish-shaped conductive mesh comprising a series of interconnected cross-wise extending conductors having a portion at the bottom thereof fused to said small dot of material providing a yieldable electrical connection thereto,
(d) and separate means for making electrical connection to another face of the body and to the conductive member.

4. A semiconductor device comprising:

(a) a wafer of semiconductor material of one conductivity-type,
(b) a small dot of material alloyed with a major face of the wafer, said material including a conductivity-determining impurity material of the opposite type so that an abrupt p-n junction is formed between the dot and the bulk of the wafer,
(c) a wire mesh member fused into the dot at a central portion and extending outwardly of the edges of the wafer,
(d) contact means bonded to the other face of the wafer providing ohmic connection to the semiconductor material of said one conductivity-type,
(e) electrode means bonded to said mesh member,
(f) and housing means encapsulating said wafer, dot and mesh, said housing means having insulating means supporting said contact means and said electrode means.

5. A tunnel diode comprising:
(a) a wafer of P-type semiconductor material,
(b) a small dot of material containing donor doping impurity alloyed with a face of the wafer providing an abrupt P-N junction,
(c) a resilient dish-shaped conductive mesh comprising a series of interconnected cross-wise extending conductors having a portion at the bottom thereof fused to said small dot of material providing a yieldable electrical connection thereto,
(d) a base plate supporting said wafer and providing electrical contact thereto,
(e) a conductive member supported by but insulated from said base plate,
(f) said mesh being bonded to the conductive member.

References Cited

UNITED STATES PATENTS

| | | | |
|---|---|---|---|
| 2,876,401 | 3/1959 | Fuller | 317—235 |
| 2,999,194 | 9/1961 | Boswell | 317—234 |
| 3,001,113 | 9/1961 | Mueller | 317—236 |
| 3,024,519 | 3/1962 | Leinkram | 29—25.3 |
| 3,030,557 | 4/1962 | Dermit | 317—234 |
| 3,109,221 | 11/1963 | Meretsky | 29—25.3 |
| 3,221,277 | 11/1965 | Hauer | 317—234 |

FOREIGN PATENTS 853,876 11/1960 Great Britain.

JAMES D. KALLAM, *Primary Examiner.*

JOHN W. HUCKERT, *Examiner.*